United States Patent
Fukui et al.

[11] Patent Number: 5,824,572
[45] Date of Patent: Oct. 20, 1998

[54] METHOD OF MANUFACTURING THIN FILM TRANSISTOR

[75] Inventors: Hirofumi Fukui; Chae Gee Sung, both of Miyagi-ken, Japan

[73] Assignee: Frontec Incorporated, Miyagi-Ken, Japan

[21] Appl. No.: 825,447

[22] Filed: Mar. 28, 1997

[30] Foreign Application Priority Data

Mar. 31, 1996 [JP] Japan .................................. 8-101988

[51] Int. Cl.⁶ ...................... H01L 21/336; H01L 21/00
[52] U.S. Cl. ............................................ 438/158; 438/159
[58] Field of Search ................................. 438/158, 155, 438/183, 200, 159, 597, 745

[56] References Cited

U.S. PATENT DOCUMENTS

| | | | |
|---|---|---|---|
| 4,624,737 | 11/1986 | Shimbo | 438/158 |
| 4,684,435 | 8/1987 | Kishi et al. | 438/158 |
| 4,704,783 | 11/1987 | Possin et al. | 438/158 |
| 4,778,773 | 10/1988 | Sukegawa . | |
| 4,843,438 | 6/1989 | Koden . | |
| 4,935,792 | 6/1990 | Tanaka et al. . | |
| 5,150,181 | 9/1992 | Takeda et al. . | |
| 5,166,085 | 11/1992 | Wakai et al. | 438/158 |
| 5,198,694 | 3/1993 | Kwasnick et al. | 257/57 |
| 5,355,002 | 10/1994 | Wu | 257/57 |
| 5,367,179 | 11/1994 | Mori et al. | 257/59 |
| 5,576,555 | 11/1996 | Yamanobe et al. | 257/53 |

FOREIGN PATENT DOCUMENTS

08032083 A  2/1996  Japan .

Primary Examiner—Mary Wilczewski
Attorney, Agent, or Firm—Brinks Hofer Gilson & Lione

[57] ABSTRACT

A method of manufacturing a thin film transistor comprising the steps of: forming a gate electrode on the surface of a substrate; forming a gate insulation film covering the gate electrode; forming an active semiconductor layer and an ohmic contact layer on the gate insulation film; forming a source/drain electrode made of Cr; and removing a portion of the ohmic contact layer except for the portion in contact with the source/drain electrode by an etching solution, wherein the step of removing the ohmic contact layer is conducted in a state of at least partially or entirely peeling a resist on the source/drain electrode made of Cr.

1 Claim, 4 Drawing Sheets

METHOD OF MANUFACTURING THIN FILM TRANSISTOR

BACKGROUND OF THE INVENTION

The present invention concerns a method of manufacturing a thin film transistor and, more in particular, it relates to a method of manufacturing a thin film transistor with small OFF current.

Thin film transistors (TFT) using amorphous silicon (a—Si:H) or polysilicon (poly Si) have been used as switching elements of individual picture elements and transistor for a driving section, for example, of a liquid crystal display device or a shutter array.

For example, when a—Si:H TFT is used as a switching element of a liquid crystal display device, it is required to apply a voltage to a gate electrode at about 20 V in an ON state of a switching element, and at about −15 V in an OFF state of the switching element since a voltage always lower than a signal voltage applied to a source electrode has to be applied to the gate electrode.

However, conventional a—Si:H TFT has a problem in that a voltage applied to a liquid crystal is lowered since a considerably large current flows also in the OFF state. Lowering of the voltage results in, for example, lowering of contrast and degradation of gradation expression to hinder image expression at high quality.

Further, when the TFT is used as a driving transistor, since a through current flows also in the OFF state, a problem of shortening the cell life in a cell-driven type liquid crystal display device.

OBJECT OF THE INVENTION

In view of the foregoing situations, it is an object of the present invention to provide a method of manufacturing a thin film transistor with a reduced OFF current.

SUMMARY OF THE INVENTION

The foregoing object of the present invention can be attained in accordance with a method of manufacturing a thin film transistor comprising a step of forming a gate electrode on the surface of a substrate, a step of forming a gate insulation film covering the gate electrode, a step of forming an active semiconductor layer and an ohmic contact layer on the gate insulation film, a step of forming a source/drain electrode made of Cr and a step of removing a portion of the ohmic contact layer except for the portion in contact with the source/drain electrode by an etching solution in which the step of removing the ohmic contact layer is conducted in a state of at least partially or entirely peeling a resist on the source/drain electrode made of Cr.

BRIEF DESCRIPTION OF THE DRAWINGS

The present invention will be explained by way of a preferred embodiment of the present invention with reference to the accompanying drawings, wherein.

DESCRIPTION OF PREFERRED EMBODIMENT

In the course of studying the structure and manufacturing conditions of TFT, the present inventors have found that the etching conditions of the ohmic contact layer have a remarkable effect on the OFF characteristic of TFT.

That is, it has been found that the OFF characteristics of manufactured TFT fluctuates greatly depending on the area of a Cr electrode (source/drain electrode) exposed to an etching solution upon etching of an n$^+$ type a—Si:H ohmic contact layer and that a certain electrochemical reaction is caused during etching to give an effect on the OFF characteristics of TFT. At first, a method of manufacturing a TFT according to the present invention will be explained with reference to FIG. 1.

FIG. 1 is a schematic view illustrating an example of a method of manufacturing a thin film transistor according to the present invention. At first, a conductive film, for example, made of Cr is formed on a glass substrate 101 by way of a sputtering method or the like, a desired resist pattern is formed by coating a photoresist, applying exposure and development and then the Cr film is etched to form a gate electrode 102 of a desired shape (FIG. 1A).

Figure 1A:
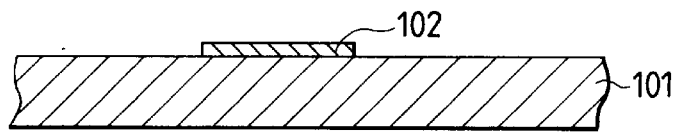
FIGS. 1A through 1F are schematic views illustrating an example of a method of manufacturing a thin film transistor (TFT) according to the present invention.
Figure 1B:
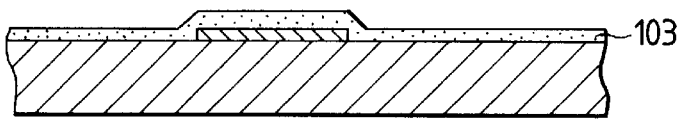

Successively, a gate insulation film 103, for example, made of silicon nitride is formed covering the gate electrode 102, for example, by a CVD method (FIG. 1B).

Figure 1C:
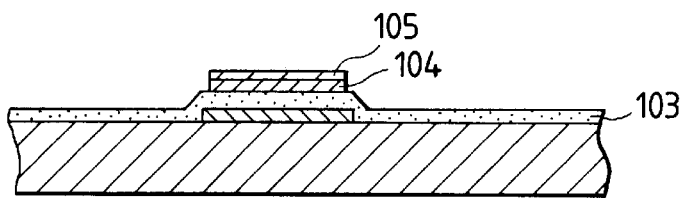

Subsequently, an active semiconductor film 104 made of i-type a—Si:H and an ohmic contact layer 105 made of an n$^+$ type a—Si:H are formed and etched to a desired shape by the photolithography like that in FIG. 1A (FIG. 1C).

Figure 1D:
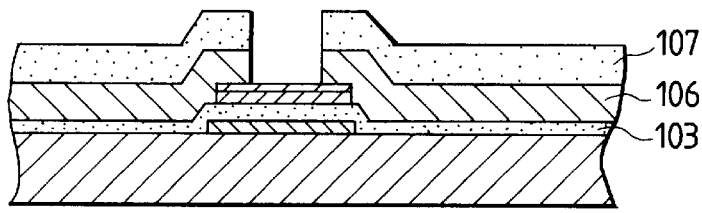

Then, a Cr film as a source/drain electrode is formed by a sputtering method, a photoresist 170 is coated and patterned to a predetermined shape and then a source/drain electrode 106 is formed by using a Cr etching solution (FIG. 1D).

Figure 1E:
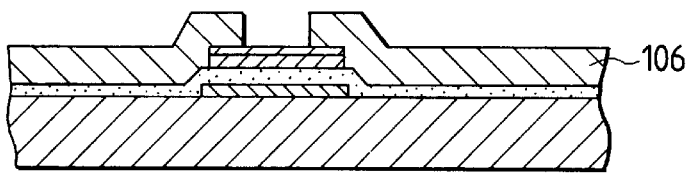
Figure 1F:
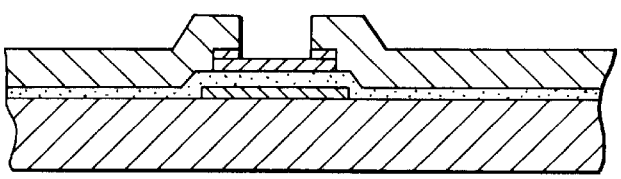

In this stage, in the prior art, the photoresist 107 was left and the ohmic contact layer on the active semiconductor layer was removed successively by etching while replacing the etching solution with that for the n$^+$ type a—Si:H. However, in the present invention, the photoresist on the Cr source/drain electrode is at first removed partially or entirely (FIG. 1E). Then, the ohmic contact layer is removed by etching using an etching solution for the n$^+$ type a—Si:H (FIG. 1F).

Subsequently, a passivation film is formed to complete the process.

With the steps as described above, a TFT with extremely small OFF current compared with a conventional TFT can be obtained.

Figure 2:
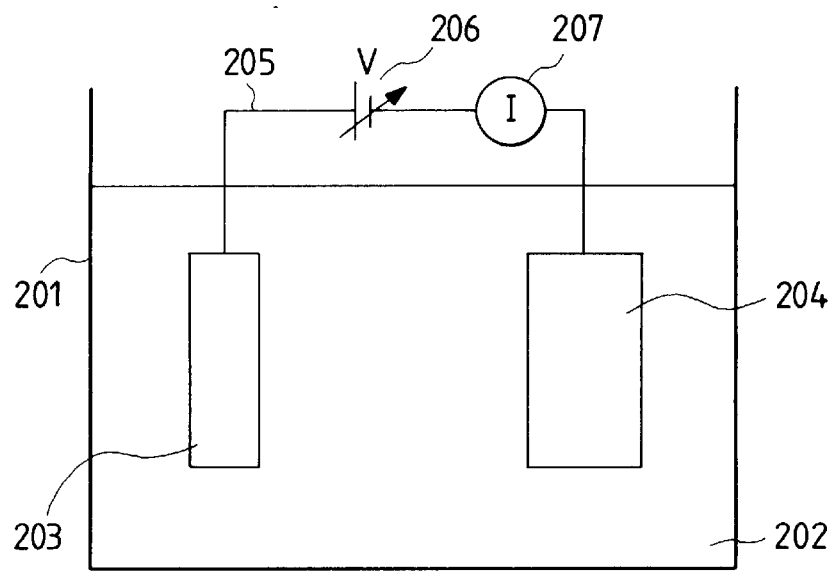
FIG. 2 shows an experimental device for studying the electrochemical effect of an ohmic contact layer in an etching step.

The present inventors have conducted the following simulative experiment for analyzing the reason of this by using a measuring system shown in FIG. 2.

In FIG. 2, a vessel 201 contains an etching solution 202 such as HF—HIO$_3$ or the like. An electrode 203 comprises a glass substrate having a Cr film of 1 μm thickness formed on the surface of a glass substrate and an electrode 204 comprises a glass substrate having an n⁺ a—Si:H film of 500 nm thickness formed on the surface. The two electrodes 203 and 204 are connected with each other by copper wire 205 by way of a DC power source 206 and a current meter 207.

Figure 3:
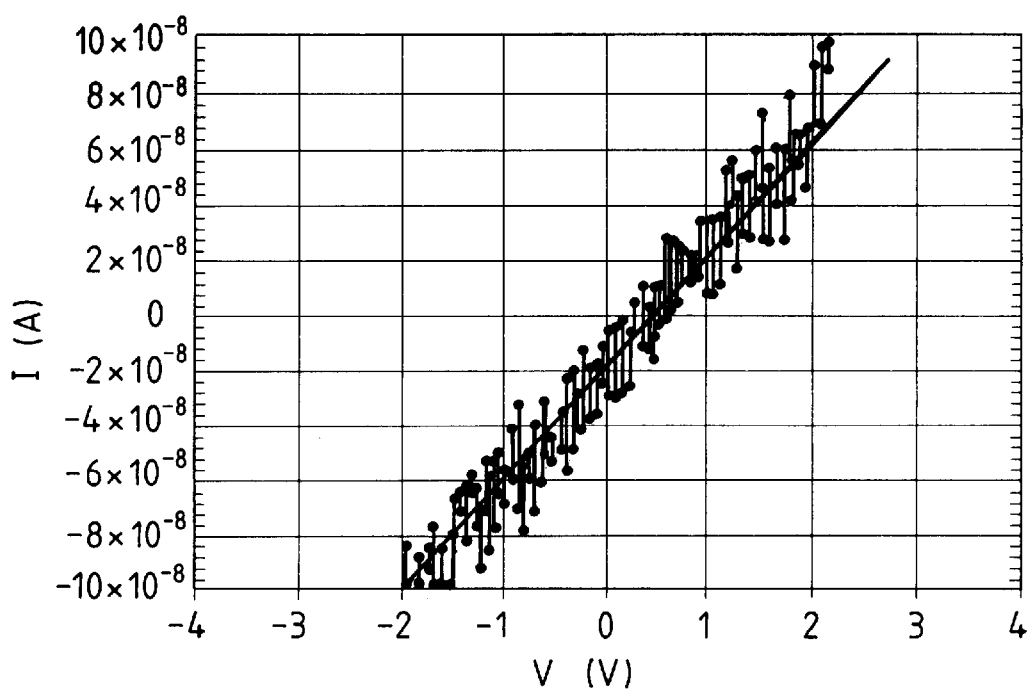
FIG. 3 is a graph illustrating an example of voltage (V)-current (I) characteristics measured by the experimental device shown in FIG. 2.
Figure 4:
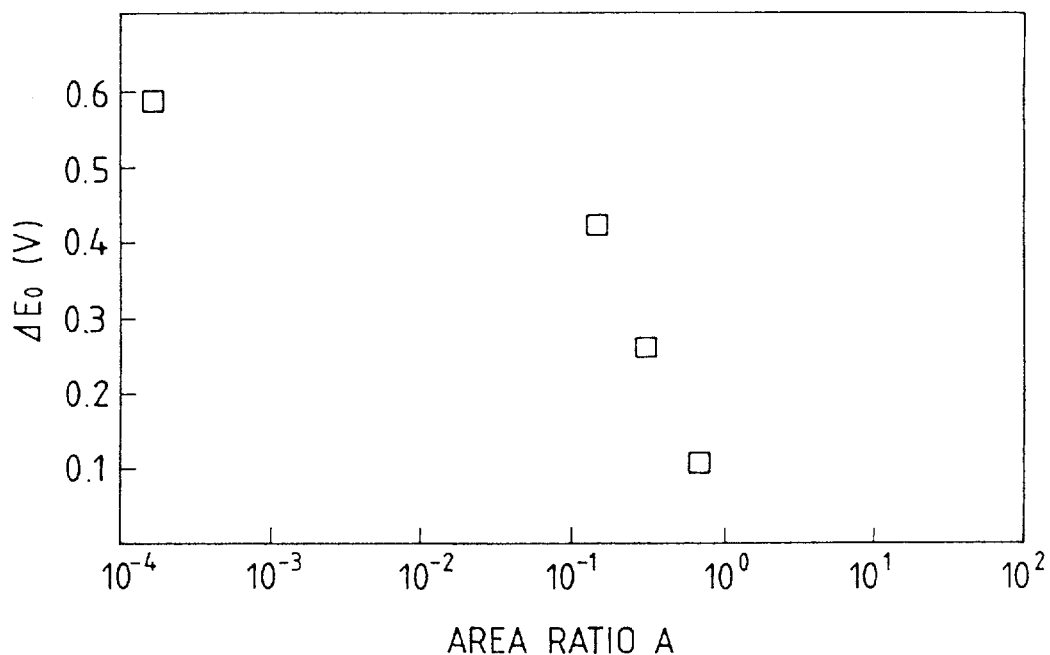
FIG. 4 is a graph illustrating a relation between $\Delta E_0$ and an electrode area ratio (Cr exposed area/n$^+$ type a—Si:H exposed area)

A relationship between voltage (V) and current (I) was examined by applying various voltages between the electrodes by the DC power source 206. An example of the results is shown in FIG. 3. In FIG. 3, a voltage at which the current (I) is reduced to zero is determined as $\Delta E_0$ and $\Delta E_0$ was determined while varying the exposed area of the Cr film. FIG. 4 shows $\Delta E_0$ as a function of an area ratio A between the Cr film and the n⁺ type a—Si:H film.

As can be seen from FIG. 4, $\Delta E_0$ gradually decreases as the area ratio A increases and it abruptly decreases if the area ratio A exceeds 0.1.

It is considered that this phenomenon is attributable to that an electrochemical reaction is caused between the Cr film and n⁺ a—Si:H film during etching if the exposed area of the Cr film is narrow, to cause damages to the n⁺ a—Si:H film.

On the other hand, if the Cr film area is wide, damages to n⁺ a—Si: H film are moderated. That is, it is considered that the $I_{OFF}$ characteristic of TFT were improved because the exposed area of the Cr film increased by removing the resist on the Cr film and the voltage applied on the n⁺ a—Si:H film was moderated.

Figure 5:
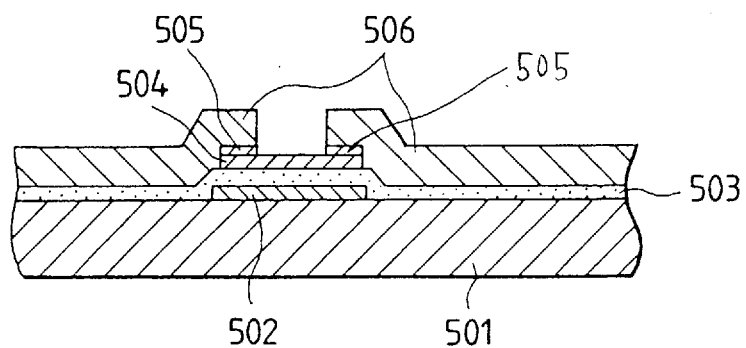
FIG. 5 is a schematic view illustrating a TFT structure.

Removal of the n⁺ type a—Si:H ohmic contact layer by etching was conducted under various conditions to manufacture TFTs shown in FIG. 5. In this case, the ohmic contact layer was etched while varying the exposed area of Cr as the source/drain electrode by using a photoresist. When Id-Vg characteristics of the manufactured TFT were measured, the OFF current changed in the same manner as in the relation between the $\Delta E_0$ and the electrode area ratio A.

In the conventional etching method for the n⁺ type a—Si:H film, since the Cr film is covered with the resist, the area exposed to the etching solution is a product of the Cr film thickness and the peripheral length of the electrode, so that it is only about $10^{-2}$–$10^{-3}$ of the exposed area of the n⁺ type a—Si:H film. Accordingly, it is considered that damages are caused in the i-type a—Si:H layer to increase the OFF current because the $\Delta E_0$ is increased like that in the simulative experiment.

Accordingly, the etching for the n⁺ type a—Si:H layer is preferably conducted by at least partially removing the photoresist on the Cr film.

In the present invention, a hydrofluoric type mixed solution containing an oxidizing agent is used generally as an etching solution for the n⁺ type a—Si:H layer in the present invention, and those containing iodic acid ions as the oxidizing agent are used preferably.

EXAMPLE

Using a method of manufacturing the thin film transistor according to the present invention shown in FIG. 1, TFT 100×100 arrays were manufactured.

At first, after precisely cleaning a glass substrate (7059, manufactured by Coning Co.) 101 of 100 mm square, a Cr film was formed to a thickness of 100 nm by a sputtering method, which was patterned by using an etching solution (a mixed solution of ceric ammonium nitrate and nitric acid) to form a gate electrode 102 (electrode width: 7 μm).

Then, by the plasma CVD method, were deposited an $SiN_x$ film (300 nm thickness) as the gate insulation film 103, an i-type a—Si:H film (100 nm thickness) as the semiconductor active film 104 and an n⁺ type a—Si:H film (20 nm) as the ohmic contact layer 105. The film forming conditions for each of the layers are shown in Table 1.

TABLE 1

| Substrate | Material: glass (Coning 7059) size: 100 mm square |
|---|---|
| Gate Electrode | Width (Lg): 7 μm, thickness = 0.1 μm, material = Cr, Manufacturing method: Sputtering method, target = Cr, gas = Ar Gas pressure = 1 Pa, Temperature = 100° C. |
| Gate insulation film | Thickness = 0.3 μm, material = $SiN_x$, Manufacturing method = CVD, gas = $SiH_4$, $NH_3,N_2$, $H_2$ Gas pressure = 70 – 100 Pa, Temperature = 250° C. |
| Active semiconductor film | Thickness = 0.1 μm, material = i-type a-Si:H, Manufacturing method = CVD, gas = $SiH_4$, $H_2$, Gas pressure = 70 – 100 Pa, Temperature = 250° C. |
| Ohmic contact layer | Thickness = 0.02 μm, material = n⁺-type a–Si:H, Manufacturing method = CVD, gas = $SiH_4$, $H_2$, $PHD_3$ Gas pressure = 70 – 100 Pa, Temperature = 250° C. |
| Conductor layer (source/drain electrode) | Thickness = 0.2 μm, material = Cr, Manufacturing method = Sputtering method, target = Cr, gas = Ar Gas pressure = 1 Pa, Temperature = 100° C. |

Successively, the active semiconductor layer 104 and the ohmic contact layer 105 were separated on every TFT devices by using an etching solution (mixed solution of $HF$—$HIO_3$).

After forming a contact holes for gate wirings, a Cr film was formed to 200 nm thickness as a conductor layer 106 by a sputtering method. The conditions for forming the Cr electrode are as shown in Table 1.

Then, the photoresist 107 was formed for forming the source/drain electrode and the data wirings, which was etched by the etching solution for Cr described above to form the source/drain electrode 106. A channel portion had a channel length of 3 μm and a channel width of 6 μm.

Then, the n⁺ type a—Si:H film on the i-type a—Si:H film was removed by using an etching solution (mixed solution of $HF$—$HIO_3$). In this case, etching was conducted by the following two methods. That is, a method of removing the n⁺ type a—Si:H film by etching width using the resist upon etching the source-drain electrode as it is (prior art) and a method of etching while exposing the surface of the Cr film to the etching solution by removing the resist on the Cr film (embodiment of the invention).

Finally, $SiN_x$ for passivation was deposited to a 400 nm thickness by a plasma CVD method, windows were opened for the gate wirings and source/drain wirings to complete the manufacture of TFT.

Figure 6A:
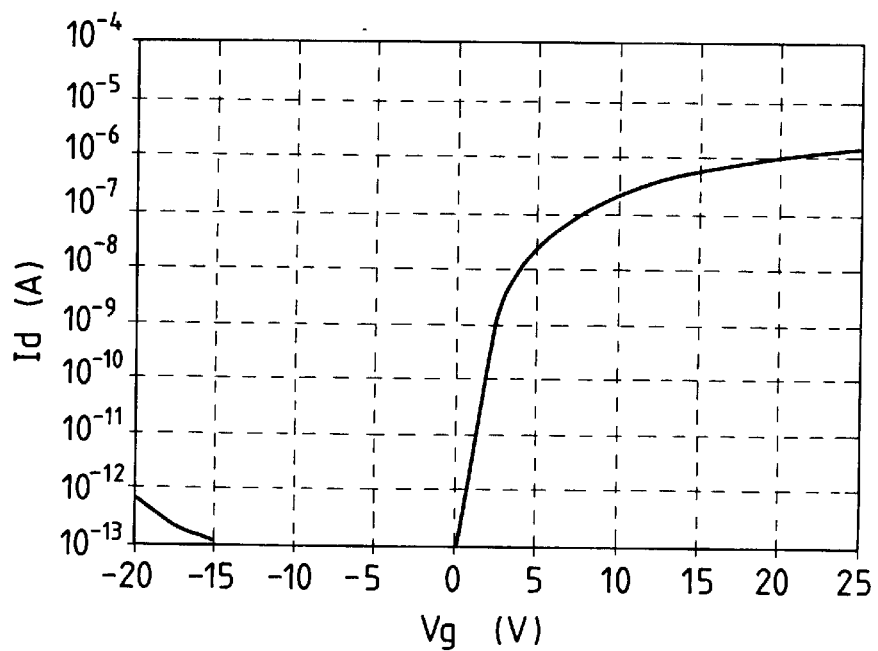
FIG. 6A is a graph illustrating an example of Id-Vg characteristics of TFT according to the present invention.
Figure 6B:
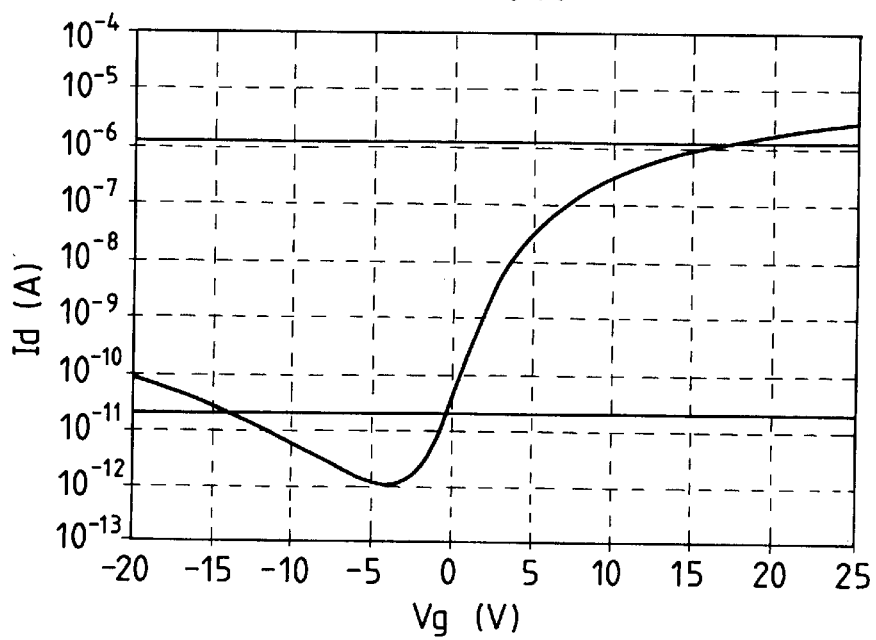
FIG. 6B is a graph illustrating an example of Id-Vg characteristics of TFT conventional example.

FIG. 6 shows results of measurement for the Id-Vg characteristics of the manufactured TFT. The characteristics of the TFT were shown in the embodiment of the present invention in FIG. 6A and in the prior art embodiment in FIG. 6B. As can be seen from FIG. 6, while the current at the gate voltage of −15 V was $3\times10^{-11}$A in the prior art embodiment, the current was reduced to $2\times10^{-13}$A in the embodiment of the present invention and the OFF characteristics of TFT was remarkably improved.

According to the present invention, TFT with a reduced OFF current can be attained and it is possible to provide a liquid crystal display device capable of expressing images at high contrast and high gradation.

Further, since the OFF current can be reduced, the TFT can be used not only as the switching element but also for the driving element of the liquid crystal display device. That is, since a switching element driving circuit of a TFT substrate in a liquid crystal display device can be manufactured simultaneously, a step of attaching an external driving circuit or the like is no more necessary thereby enabling to remarkably reduce the manufacturing cost.

Further, since the through current of the driving device can be suppressed greatly, the cell exchange cycle for the cell driven type display device can be extended remarkably.

What is claimed is:

1. A method of manufacturing a thin film transistor comprising the steps of:

forming a gate electrode on a surface of a substrate;

forming a gate insulation film covering the gate electrode;

forming an active semiconductor layer and an active ohmic contact layer on the gate insulation film;

forming a Cr film;

forming a resist on the Cr film in a pattern of a source/drain electrode;

forming a source/drain electrode made of Cr;

peeling at least partially or entirely the resist; and removing a portion of the ohmic contact layer except for the portion in contact with the source/drain electrode by using an etching solution, wherein the step of removing the ohmic contact layer is conducted after at least partially or entirely peeling the resist on the source/drain electrode made of Cr.

* * * * *